(12) United States Patent
Hua et al.

(10) Patent No.: US 8,259,888 B2
(45) Date of Patent: Sep. 4, 2012

(54) METHOD OF PROCESSING SIGNAL DATA WITH CORRECTED CLOCK PHASE OFFSET

(75) Inventors: Junqi Hua, Cary, NC (US); Alberto Baldisserotto, Fuquay Varina, NC (US); Steven White, Raleigh, NC (US)

(73) Assignee: Integrated Device Technology, Inc., San Jose, CA (US)

( * ) Notice: Subject to any disclaimer, the term of this patent is extended or adjusted under 35 U.S.C. 154(b) by 940 days.

(21) Appl. No.: 12/153,803

(22) Filed: May 23, 2008

(65) Prior Publication Data

US 2009/0289672 A1 Nov. 26, 2009

(51) Int. Cl.
H03D 3/24 (2006.01)

(52) U.S. Cl. ........ 375/375; 375/327; 375/330; 375/295; 375/316; 331/16; 331/25; 455/147; 455/208; 455/130; 455/139; 455/141

(58) Field of Classification Search .................. 375/375, 375/327, 330, 295, 316; 331/16, 1 R, 25; 455/147, 208, 130, 139, 141
See application file for complete search history.

(56) References Cited

U.S. PATENT DOCUMENTS

| | | | |
|---|---|---|---|
| 4,475,088 A * | 10/1984 | Beard | 331/25 |
| 5,132,988 A | 7/1992 | Fisher et al. | |
| 5,150,128 A * | 9/1992 | Kongelbeck | 342/174 |
| 5,392,295 A | 2/1995 | Coker et al. | |
| 5,635,876 A * | 6/1997 | Gerrits et al. | 331/45 |
| 5,764,655 A | 6/1998 | Kirihata et al. | |
| 6,163,867 A | 12/2000 | Miller et al. | |
| 6,298,458 B1 | 10/2001 | Cranford, Jr. et al. | |
| 6,694,462 B1 | 2/2004 | Reiss et al. | |
| 6,809,591 B1 | 10/2004 | Ohashi | |
| 7,010,069 B2 | 3/2006 | Chugg et al. | |
| 7,116,953 B2 * | 10/2006 | Kim et al. | 455/147 |
| 7,243,272 B2 | 7/2007 | Tarango et al. | |
| 7,295,604 B2 | 11/2007 | Cranford, Jr. et al. | |
| 7,352,165 B2 | 4/2008 | Loke et al. | |
| 7,405,594 B1 | 7/2008 | Xu | |
| 7,408,387 B2 | 8/2008 | Suenaga | |
| 7,532,053 B2 | 5/2009 | Rausch | |
| 7,558,991 B2 | 7/2009 | Mattes et al. | |
| 7,577,192 B2 | 8/2009 | Matis | |
| 7,610,526 B2 | 10/2009 | Sherlock et al. | |
| 7,667,502 B2 | 2/2010 | Agarwal | |
| 7,675,363 B2 | 3/2010 | Deguchi et al. | |
| 7,756,197 B1 | 7/2010 | Ferguson et al. | |
| 7,777,998 B2 | 8/2010 | Stockinger et al. | |
| 7,791,391 B2 * | 9/2010 | Yoon et al. | 327/254 |
| 7,809,052 B2 | 10/2010 | Li | |

(Continued)

FOREIGN PATENT DOCUMENTS

WO 20071053111 5/2007

*Primary Examiner* — Siu Lee
(74) *Attorney, Agent, or Firm* — Nixon & Vanderhye P.C.

(57) ABSTRACT

The present invention provides a method of processing signal data comprising generating a first clock signal and a second clock signal and processing the signal data using the first clock signal and the second clock signal. While processing the signal data, the phase difference between the first clock signal and the second clock signal is measured and corrected for so that a target phase difference between the first clock signal and the second clock signal is maintained.

17 Claims, 6 Drawing Sheets

U.S. PATENT DOCUMENTS

| | | |
|---|---|---|
| 7,817,387 B2 | 10/2010 | Khazhinsky et al. |
| 2002/0039052 A1* | 4/2002 | Straub et al. ................... 331/45 |
| 2003/0102928 A1* | 6/2003 | d'Haene et al. ................ 331/172 |
| 2004/0106380 A1* | 6/2004 | Vassiliou et al. ................ 455/73 |
| 2004/0141268 A1 | 7/2004 | Miller et al. |
| 2004/0217753 A1* | 11/2004 | Yamanaka et al. ......... 324/76.21 |
| 2005/0036576 A1 | 2/2005 | Agazzi et al. |
| 2005/0057872 A1 | 3/2005 | Lee et al. |
| 2005/0185351 A1 | 8/2005 | Miller et al. |
| 2005/0193290 A1 | 9/2005 | Cho et al. |
| 2005/0245225 A1* | 11/2005 | Park et al. .................... 455/313 |
| 2006/0020865 A1 | 1/2006 | Dai et al. |
| 2006/0087328 A1 | 4/2006 | Sasajima |
| 2006/0087356 A1 | 4/2006 | Minzoni |
| 2006/0114629 A1 | 6/2006 | Wu et al. |
| 2007/0026809 A1 | 2/2007 | Zhang et al. |
| 2007/0053120 A1 | 3/2007 | Gauthier et al. |
| 2007/0101214 A1 | 5/2007 | Stauffer et al. |
| 2007/0121713 A1 | 5/2007 | Yamaguchi |
| 2007/0146014 A1* | 6/2007 | Cheung ........................... 327/20 |
| 2007/0189195 A1* | 8/2007 | Belotserkovsky ............ 370/315 |
| 2007/0195875 A1 | 8/2007 | Agazzi et al. |
| 2008/0062597 A1 | 3/2008 | Chen et al. |
| 2008/0130800 A1* | 6/2008 | Maxim et al. ................. 375/345 |
| 2008/0225380 A1 | 9/2008 | Heffner et al. |
| 2008/0237587 A1 | 10/2008 | Nierle et al. |
| 2008/0240212 A1 | 10/2008 | Satou |
| 2008/0285358 A1 | 11/2008 | Nierle |
| 2009/0003495 A1 | 1/2009 | Wu et al. |
| 2009/0041101 A1 | 2/2009 | Nagatani |
| 2009/0116851 A1 | 5/2009 | Heffner et al. |
| 2009/0177457 A1 | 7/2009 | Dai et al. |
| 2009/0185609 A1 | 7/2009 | Takada |
| 2009/0249139 A1 | 10/2009 | Wang et al. |
| 2009/0257334 A1 | 10/2009 | Ogura et al. |
| 2009/0316767 A1 | 12/2009 | Hidaka |
| 2010/0020861 A1 | 1/2010 | Leibowitz et al. |
| 2010/0233971 A1* | 9/2010 | Vassiliou et al. ................ 455/73 |

* cited by examiner

METHOD OF PROCESSING SIGNAL DATA WITH CORRECTED CLOCK PHASE OFFSET

BACKGROUND OF THE INVENTION

1. Field of the Invention

The present invention relates to processing signal data and in particular relates to correcting clock phase offset while processing signal data.

2. Description of the Prior Art

Clock path delay mismatch or clock phase offset is an important parameter in signal data processing and consequently in the design of signal data processors. As signal data processors become ever smaller (due to process shrinking) and more complex, this parameter becomes a more significant problem faced by the designers of such signal data processors.

There are various reasons for the increasing significance of clock phase offset. Firstly as complementary metal-oxide-semiconductor (CMOS) minimum feature sizes become smaller, the mismatch between different clock buffers or different clock paths increases dramatically. It is known in the art that offset voltage is dependent upon the threshold voltage ($V_t$) mismatch and $\beta$ mismatch. Although $\beta$ mismatch contributes more with smaller feature sizes, in current mainstream CMOS technology, the $V_t$ mismatch is the dominant factor. The $V_t$ offset ($V_{os}$) can be calculated as the following equation:

$$Vos|_{\rm rms} = \frac{Av}{\sqrt{nwl}}$$

where $V_{os}$ is the RMS offset voltage,

Av is a process parameter, n is the finger number, and w and l are the MOSFET width and length respectively.

Although Av is improved slightly, in order to take advantage of the advanced CMOS technology, $V_{os}$ is still increasing due to smaller MOSFET size. For each buffer stage, the delay mismatch ($\Delta T_d$) can be calculated as the following equation:

$$\Delta Td = \frac{Vos}{SR}$$

where SR is the clock slew rate.

Figure 1:
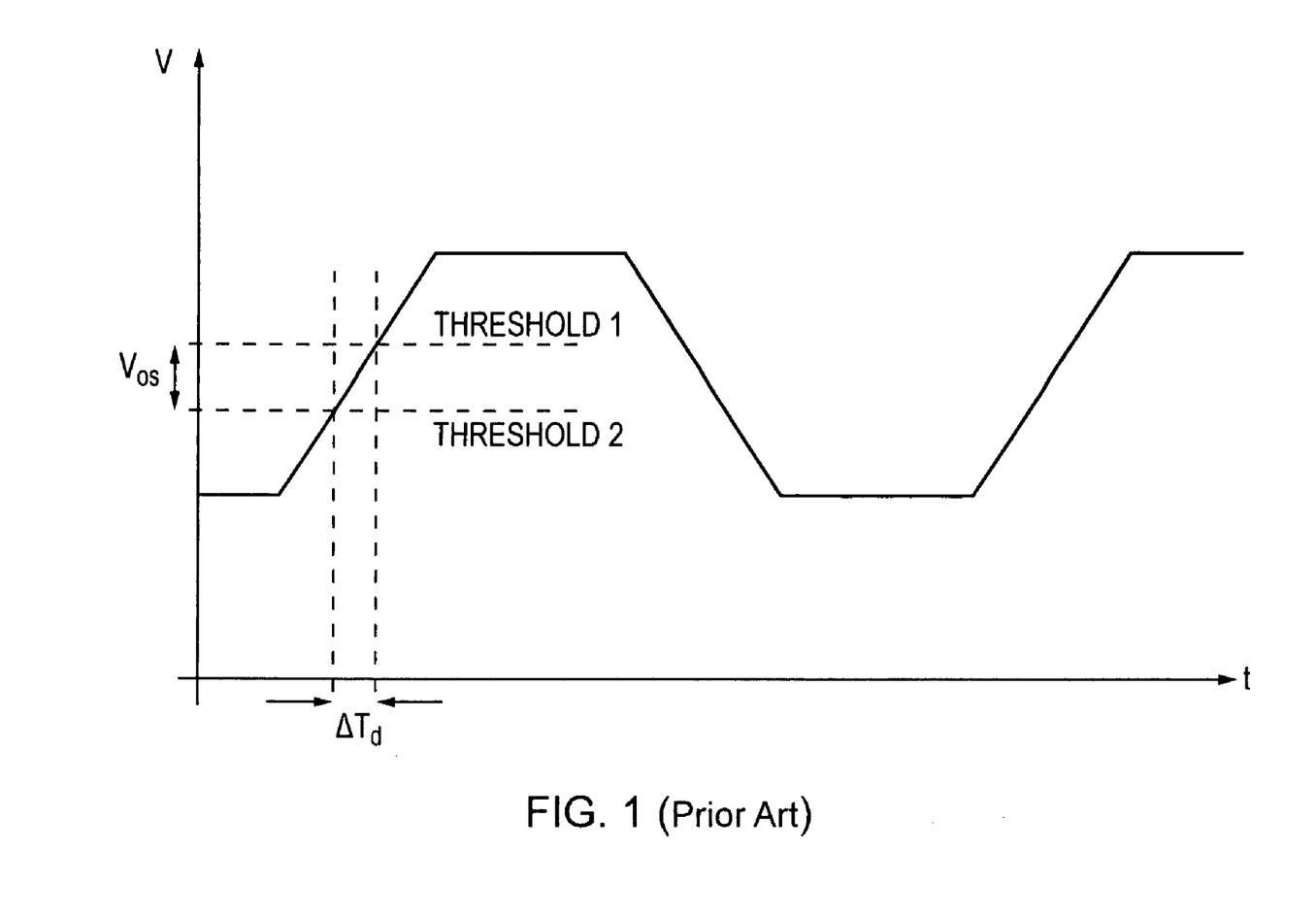
FIG. 1 schematically illustrates the relationship between voltage offset and delay mismatch.

Assuming same clock rate and same slew rate design, $\Delta T_d$ is proportional to Vos as shown in FIG. 1. In this figure, threshold 1 is the switch point of a first clock buffer 1 and threshold 2 is the switch point of a second clock buffer 2. Threshold 1=threshold 2+Vos due to the mismatch.

Secondly, due to the increased complexity of mixed signal circuit (high speed PHY) designs, clock distribution becomes more involved. Clocks need more buffers or more complicated clock trees to be delivered to their destinations, which increases the clock delay mismatch significantly.

Thirdly, higher data and clock rates make the situation even worse even with the same $\Delta T_d$ design. The phase offset is proportional to the data rate, thus worsening as data rates increase.

According to the prior art the clock phase offset is corrected for in an initial calibration phase, e.g. during power up reset. This initial calibration can correct most of the clock phase offset. The present techniques recognise that later-arising temperature and/or power supply (e.g. low frequency power supply noise) induced offset can cause further offset to be introduced. Such factors become more significant as geometries decrease and may cause the clock offset to vary. Such dynamic variation in the clock offset can lead to levels of jitter that are problematic when signal data processing.

Figure 2:
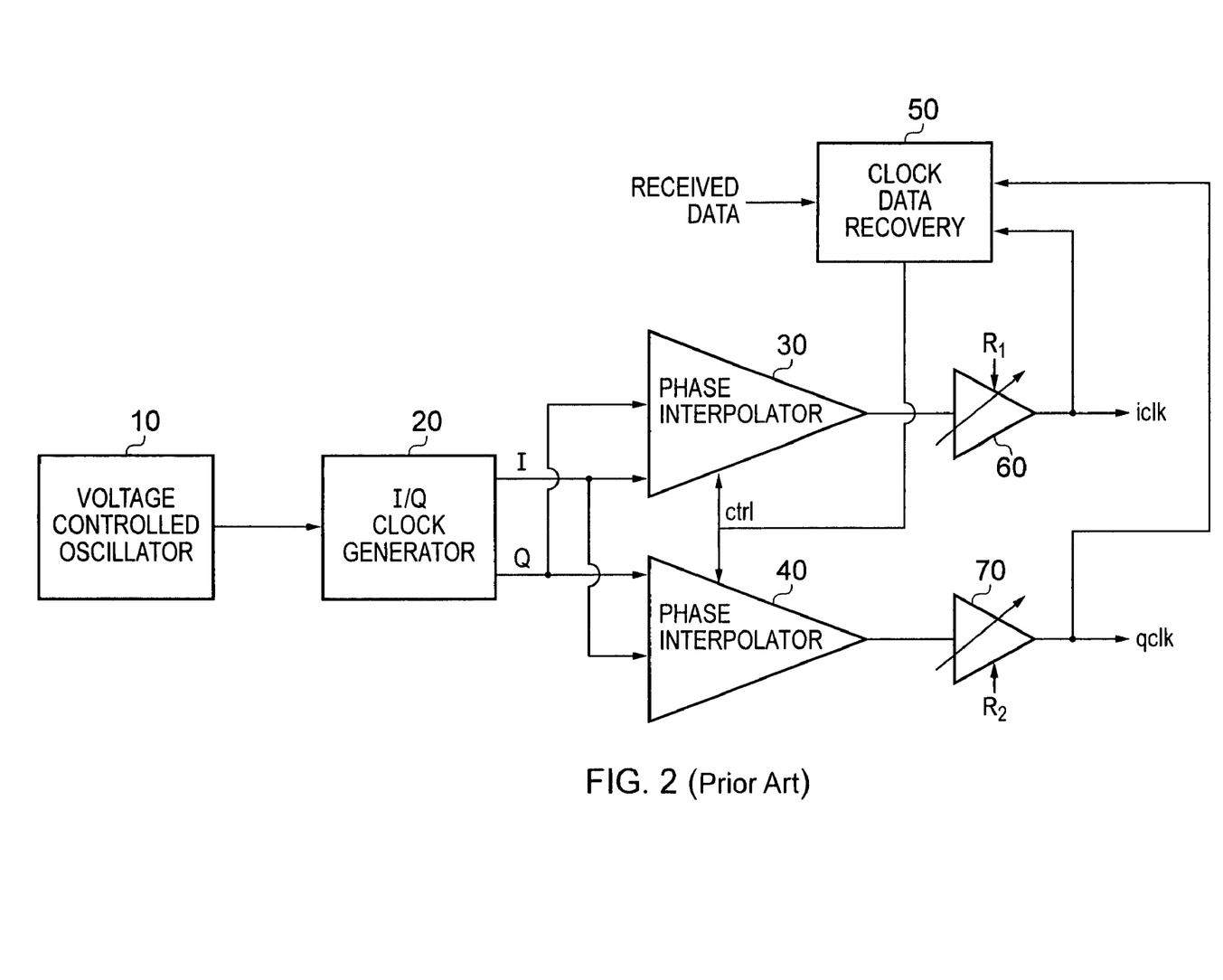
FIG. 2 schematically illustrates the generation of two statically calibrated clock signals using phase interpolators in the prior art.

FIG. 2 schematically illustrates an arrangement for the generation of two clock signals in a receiver aligned with a received data stream in the prior art. A voltage controlled oscillator (VCO) 10 generates a single frequency clock locked to a reference clock. I/Q clock generation block 20 creates two clock signals (I clock and Q clock) with a 90 degree offset from one another. In order to align these clocks with the received data stream, each of the I/Q clocks is then passed to two phase interpolators (PIs) 30 and 40. Phase interpolators 30 and 40 are controlled by the digital vector ctrl which is determined by the clock data recovery performed by clock data recovery unit 50 on the received data stream. Phase interpolators 30 and 40 then generate two new clocks iclk and qclk with 90 degree offset from one another, as well as aligned with the incoming data. The iclk and qclk clocks are then used to sample and recover the incoming signal data received by the apparatus. The calibration of this arrangement is provided by delay units 60 and 70, the control values of which are set in registers $R_1$ and $R_2$ at an initial calibration phase prior to processing data.

Figure 3:
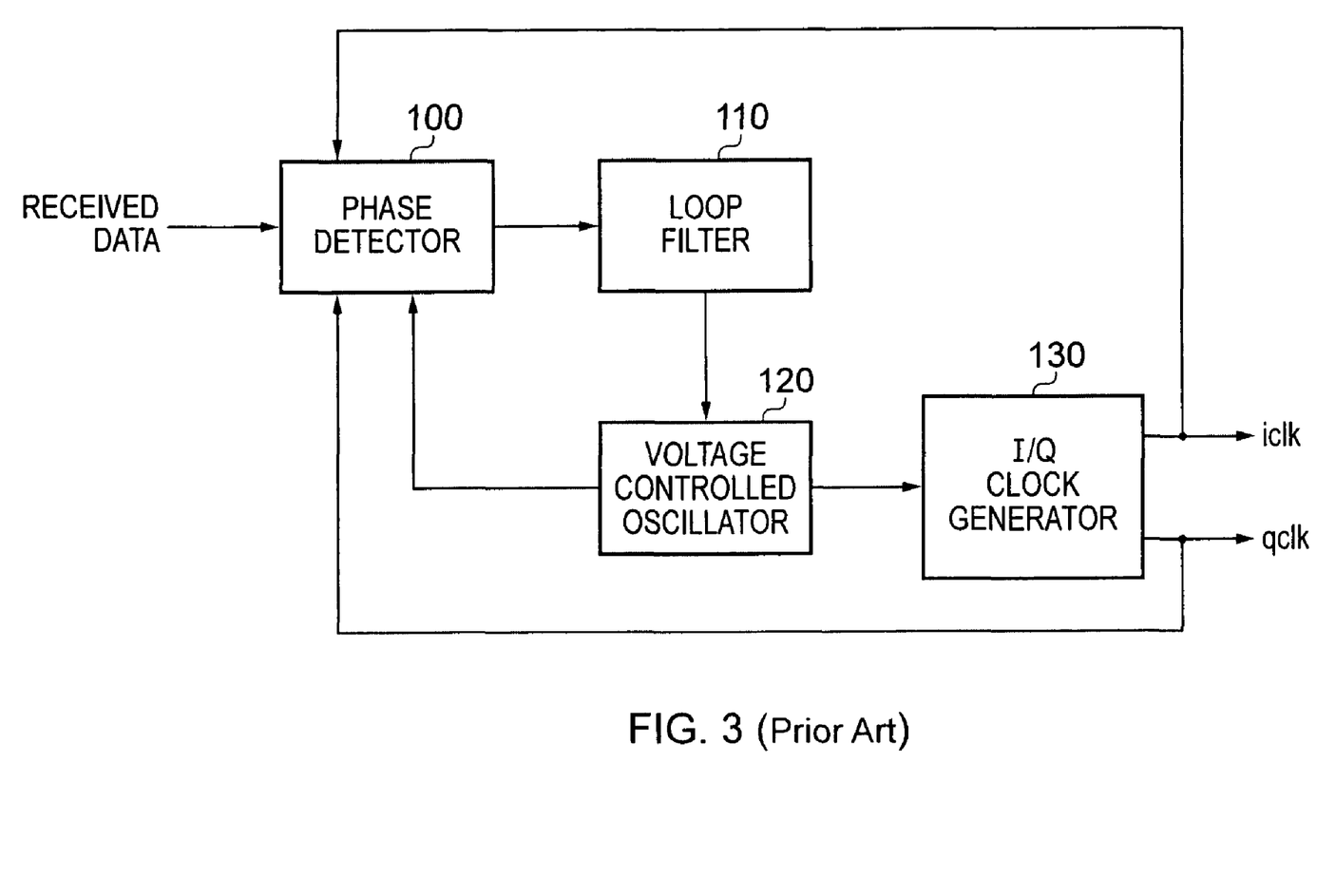
FIG. 3 schematically illustrates the generation of two clock signals using a phase locked loop.

A data receiver may alternatively generate iclk and qclk aligned with a stream of received data by means of phase locked loop (PLL) based clock generation. An example arrangement is schematically illustrated in FIG. 3. Here a phase detector 100 receives the incoming data stream and passes phase information via a loop filter 110 to voltage controlled oscillator (VCO) 120. The VCO provides a reference signal to I/Q clock generator 130 which generates iclk and qclk. The iclk and qclk are fed back to phase detector 100, so that the loop is locked and so that iclk and qclk are aligned with the stream of received data. This arrangement could also be calibrated by delay units (not illustrated) at an initial calibration phase as discussed with reference to FIG. 2.

Returning to the example arrangement of FIG. 2, the phase interpolators, although perhaps initially calibrated by the delay units following them within the required tolerances, are recognised by the present techniques to suffer from various further impairments such as delay mismatch and integral non-linearity (INL). Because of this iclk and qclk not only suffer from static clock offset (e.g delay mismatch), but may also suffer from dynamically evolving clock offsets (e.g due to INL, temperature dependent delay mismatch or power supply dependent mismatch). The latter dynamic clock offsets are not addressed by power up reset or initial calibration, and as application speeds increase and process geometries decrease dynamic offset becomes one of the most significant limiting factors on coping with variations in clock phase offsets.

It is thus desirable to provide a method of processing signal data in which this dynamically arising clock offset is addressed.

SUMMARY OF THE INVENTION

According to a first aspect of the invention there is providing a method of processing signal data comprising the steps of:

generating a first clock signal and a second clock signal;

processing said signal data using said first clock signal and said second clock signal;

while processing said signal data, measuring a measured phase difference between said first clock signal and said second clock signal; and adjusting a current phase offset of at least one of said first clock signal and said second clock signal in dependence upon said measured phase difference, such that a target phase difference between said first clock signal and said second clock signal is maintained.

Whilst static offset can be corrected for by initial calibration, dynamic clock offsets which evolve during use of a signal data processing apparatus cannot. The present technique recognises and addresses this by continuously measuring the phase difference between the first and second clock signals and adjusting the current phase offset of at least one of those clock signals in dependence of the measured phase difference. In this way a target phase difference between the clock signals can be maintained, despite the evolution of dynamic clock offsets during the operation of the signal data processing apparatus. Hence account may be made for both static and dynamic sources of clock phase offset. Not only may initial clock offsets be calibrated for, but clock phase offset is monitored and corrected for in real time.

In one embodiment of the present invention the method further comprises an initial calibration step prior to processing said signal data of measuring an initial phase difference between said first clock signal and said second clock signal; and presetting an initial phase offset of at least one of said first clock signal and said second clock signal in dependence of said initial phase clocks.

Whilst it is possible for all correction of clock phase offsets to be performed dynamically during normal operation of the signal data processing apparatus, an initial calibration step may advantageously be carried out to perform a static phase offset correction. Then only the dynamically evolving clock offsets need be corrected for by the continuous monitoring and correcting process.

The present invention may be employed to continuously correct clock offset in a range of signal data processing scenarios. In one embodiment the signal data is received signal data, whereas in another embodiment the signal data is signal data to be transmitted.

According to one embodiment the method further comprises the step of: generating at least one phase control signal in dependence upon said measured phase difference, said adjusting said current phase difference being controlled by said at least one phase control signal. Generating at least one phase control signal represents a convenient manner of signalling the necessary adjustment to be made to the current phase difference.

It will be appreciated by those skilled in the art that the adjustment of the current phase offset may be performed in a variety of ways. According to one embodiment adjusting said current phase offset is performed by at least one phase interpolator. According to another embodiment said adjusting said current phase offset is performed by at least one phase locked loop unit. According to yet another embodiment said adjusting said current phase offset is performed by at least one delay unit.

It will be appreciated that the phase control signal may be generated in a variety of ways, but in one embodiment the at least one phase control signals generated by a digital processing unit. The digital processing unit thus coordinates the at least one phase control signal and thus the necessary adjustment of the current clock phase offset. The at least one phase control signal may of course take a variety of forms. In one embodiment the at least one phase control signal is a digital control vector.

Whist in some embodiments the first and second clock signals are separately generated, in one embodiment a single clock signal is generated which is provided as both said first clock signal and said second clock signal whilst it is then necessary for the entire desired clock phase offset between the first and second clock signals to be generated by the adjustment of the current phase difference, this arrangement has the simplifying advantage of only a single clock signal needing to be generated. It will further be appreciated that whilst the target phase difference between the first and second clock signal could fall anywhere between 0 and 360 degrees, in one embodiment the target phase difference is 90 degrees.

In such an embodiment where the target phase difference is 90 degrees, the first clock signal may be defined as an I-clock and the second clock signal may be defined as a Q-clock. These "in phase" and "quadrature phase" clocks may then be used, for example, to sample and recover data from a received data stream.

In the situation where the signal data is received signal data, the received signal data may have a clock signal embedded in it and in one embodiment the first clock signal and/or second clock signal are aligned with a recovered clock signal recovered from the received signal data. It will be recognised that this alignment assists in the accurate signal data processing of that received signal data.

Whilst in some embodiments a phase control signal may be generated for each measured phase difference, in one embodiment generating said at least one phase control signal is performed in dependence upon a plurality of measured phase differences. In this way variations over time may be monitored and appropriately responded to.

According to a second aspect of the present invention there is provided a signal data processing apparatus comprising:

clock generating circuitry configured to generate a first clock signal and a second clock signal processing circuitry responsive to said first clock signal and said second clock signal to process said signal data;

measuring circuitry operating while said processing circuitry processes said signal data to measure a measured phase difference between said first clock signal and said second clock signal; and adjusting circuitry configured to adjust a current phase offset of at least one of said first clock signal and said second clock signal in dependence upon said measured phase difference, such that a target phase difference between said first clock signal and said second clock signal is maintained.

According to a third aspect of the present invention there is provided a signal data processing apparatus comprising:

generating means for generating a first clock signal and a second clock signal processing means for processing said signal data using said first clock signal and said second clock signal;

measuring means for, while processing said signal data, measuring a measured phase difference between said first clock signal and said second clock signal; and adjusting means for adjusting a current phase offset of at least one of said first clock signal and said second clock signal in dependence upon said measured phase difference, such that a target phase difference between said first clock signal and said second clock signal is maintained.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 4:
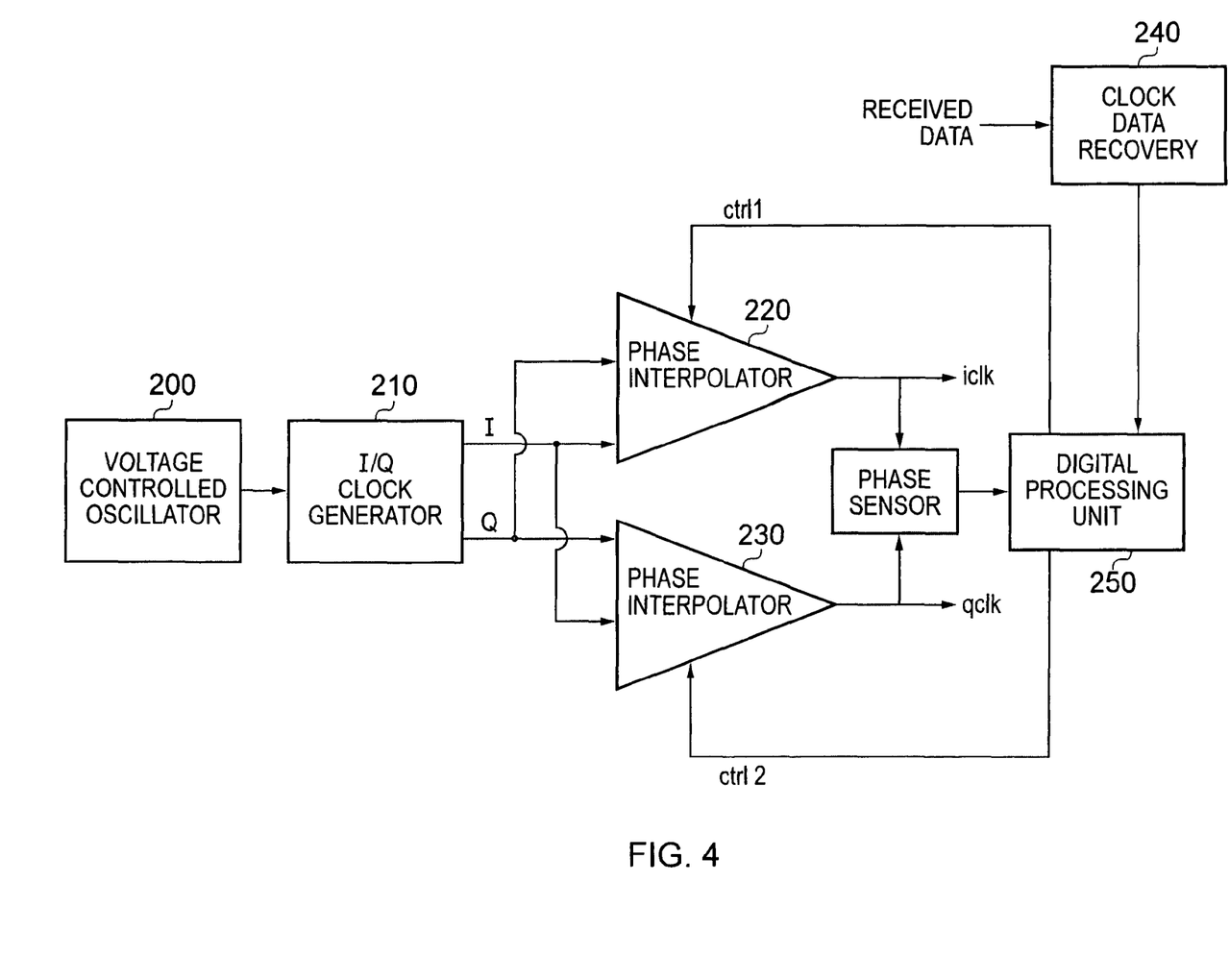
FIG. 4 schematically illustrates the generation of two dynamically calibrated clock signals according to a first example embodiment of the present invention.

FIG. 4 schematically illustrates a first example embodiment of the present invention in which a receiver generates two clock signals aligned with the clock signal in a received data stream. Voltage control oscillator (VCO) 200 generates a single frequency clock locked to a reference clock. This single frequency clock is passed to I/Q clock generation block 210 which creates two clocks with 90 degree offset from one another (I-clock and Q-clock). Note that in other embodiments it is also possible for the VCO to generate the I/Q clocks directly. The I and Q clocks are then passed to phase interpolators (PIs) 220 and 230. From these inputs the two PIs create two new clocks, iclk and qclk, with 90 degree offset from one another, as well as aligned with the clock signal in the received data. The iclk and qclk clocks are then used to sample and recover incoming data.

The alignment of iclk and qclk with the clock signal in the received data occurs by means of clock data recovery unit 240, which recovers the embedded clock signal from the received data, passing that clock data information to digital processing unit 250. If no further dynamic adjustment of the clock signals is required (see below), then both PI 220 and PI 230 receive the same digital control signal ctrl (the same digital control signal as was described with reference to FIG. 2). In other words, ctrl1=ctrl and ctrl2=ctrl. As also described with reference to FIG. 2, this steering of the PIs may be calibrated at startup, to account for static offset.

Meanwhile, phase sensor 260 also receives the clock signals iclk and qclk, and measures the phase difference between them. This phase offset information is then forwarded to digital processing unit 250 which then varies the digital control signal ctrl it sends to each PI, i.e. it generates two distinct control signals, ctrl1 and ctrl2. Ctrl1 is fed back to phase interpolator 220 and ctrl2 is fed back to phase interpolator 230. Any variation from the target phase difference (in this embodiment a 90 degree offset between iclk and qclk) is then immediately corrected for by virtue of the control signals ctrl1 and ctrl2 reaching phase interpolators 220 and 230. In some embodiments it is possible for digital processing unit 250 to always leave one of the control signals at its "default" value of ctrl, and only to apply any timing adjustment (whether positive or negative) to the other control signal.

The apparatus schematically illustrated in FIG. 4 may also be used as a static clock offset correction circuit, for example as a power up reset calibration apparatus, whereby no separate calibration of ctrl is performed and an initial phase offset measurement by phase sensor 260 is made at startup dictating the initial values of ctrl1 and ctrl2. Phase sensor 260 is then switched off during signal data processing operations of the apparatus and ctrl1 and ctrl2 only vary as ctrl would in order to align iclk and qclk with the received data.

Digital processing unit 250 may be arranged to compensate for both low frequency offset components as well as high frequency offset components depending upon the particular implementation. In the case of compensating for low frequency offset, the digital processing unit can gather a number of phase difference measurements from phase sensor 260 taken over a period of time to average out the high frequency variations.

Figure 5:
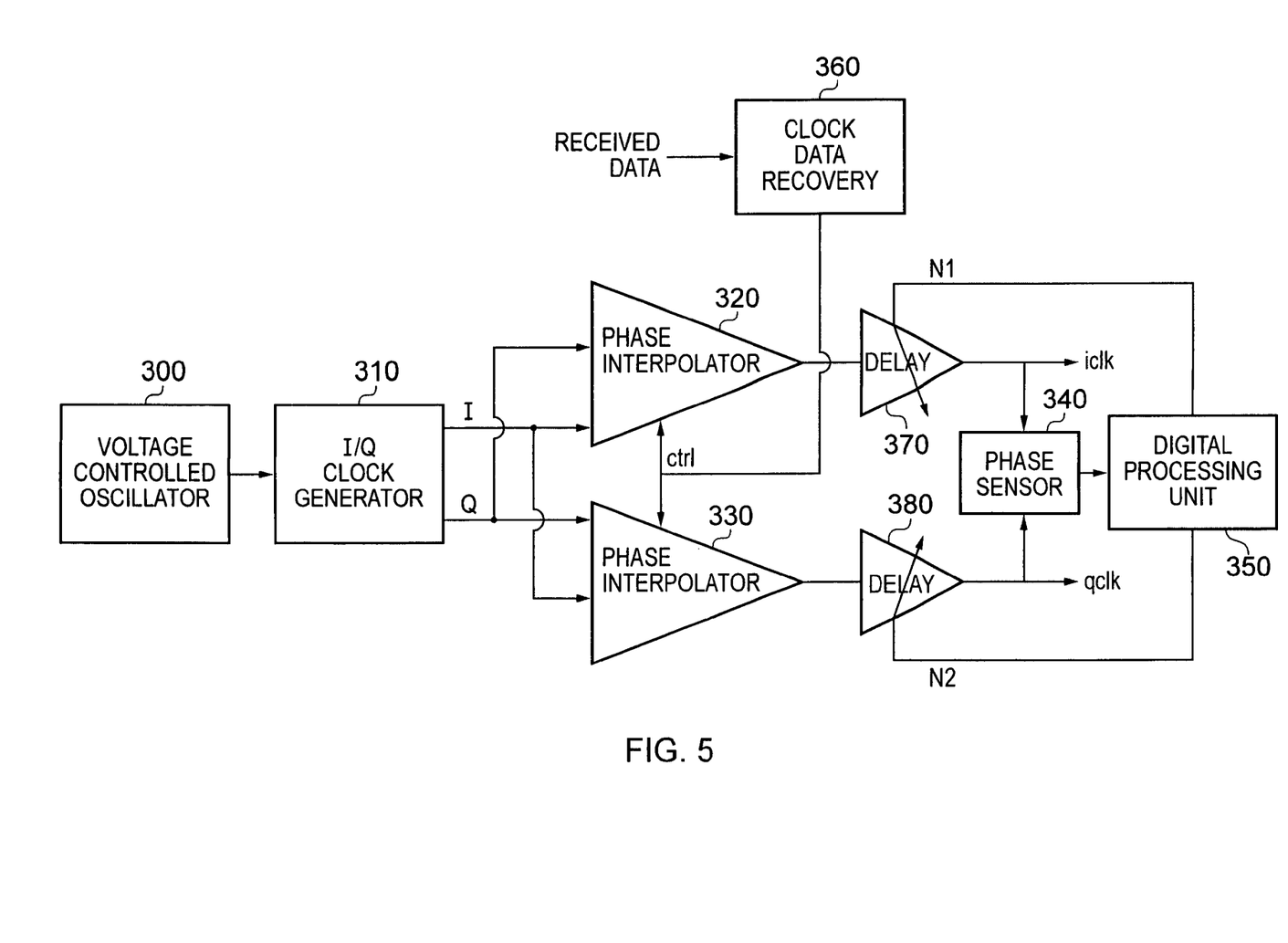
FIG. 5 schematically illustrates the generation of two dynamically calibrated clock signals according to a second example embodiment of the present invention.

FIG. 5 illustrates a second example embodiment of the present invention. In this embodiment voltage controller oscillator 300, I/Q clock generator 310 and phase sensor 260 behave in the same manner as described for the equivalent components in FIG. 4 and are not described in further detail here. In this embodiment phase interpolators 320 and 330 are not controlled by digital processing unit 350, but are steered by a single digital control vector ctrl. The digital control vector ctrl derives from clock data recovery unit 360, which recovers the clock signal embedded in the received data stream. This enables PIs 320 and 330 to generate iclk and qclk aligned with the clock signal in the received data stream. In this embodiment iclk and qclk have a target phase difference of 90 degrees. Phase sensor 340 monitors iclk and qclk, measuring the phase difference between them and passing this information to digital processing unit 350. The digital processing unit 350 creates control signals N1 and N2 which are passed back to delay units 370 and 380. Delay units 370 and 380 are then steered by the control signals N1 and N2 respectively to apply any necessary phase offset correction to the iclk and qclk clock signals. It will be appreciated that delay units 370 and 380 must have sufficient delay variation to cover the possible range of offsets required. The maximum offsets required may be established by Monte Carlo simulation. In this embodiment the clock data recovery phase information (ctrl) has been separated from the dynamic phase offset information (N1 and N2). In the previous embodiment illustrated in FIG. 4 this information was combined, i.e. ctrl1=ctrl+N1 and ctrl2=ctrl+N2.

Figure 6:
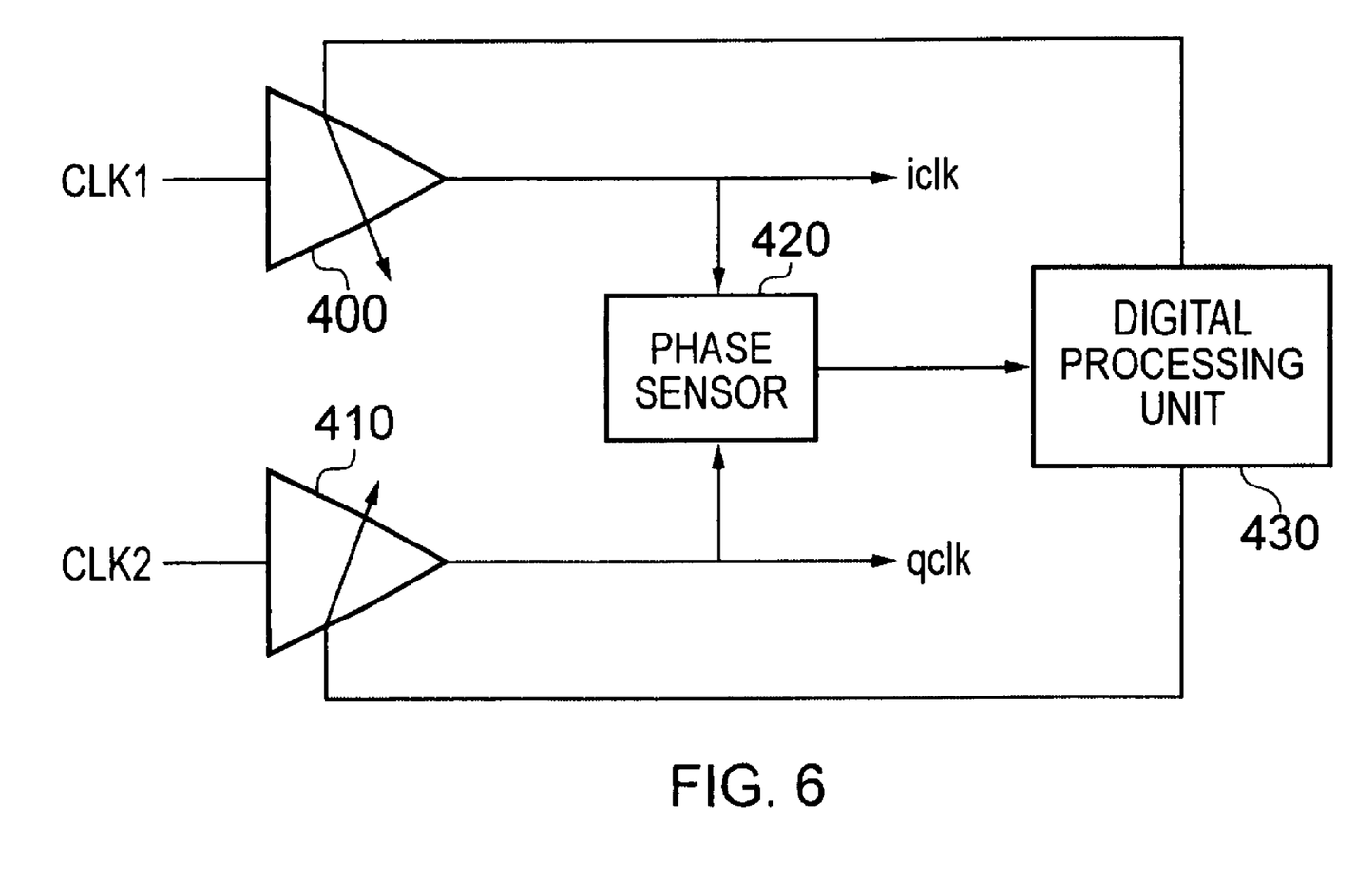
FIG. 6 schematically illustrates the generation of two dynamically calibrated clock signals according to a third example embodiment of the present invention.

In some applications no phase interpolators may be needed (for example, in a transmitter or in a PLL based data receiver such as that shown in FIG. 3) and in such a situation an arrangement such as that schematically illustrated in FIG. 6 may be employed. Two clock signals clk1 and clk2 are fed into delay units 400 and 410 respectively. Delay units 400 and 410 must then apply sufficient clock phase offset to generate the target phase clock phase difference between the clock signals iclk and qclk. The feedback system works as described with reference to FIG. 5, in that phase sensor 420 measures the phase difference between iclk and qclk, passing this information to digital processing unit 430 which then generates control signals N1 and N2 which are fed back to delay units 400 and 410 respectively. Note that in this arrangement it is possible for clk1 and clk2 to in fact be the same clock signal, this being possible so long as delay units 400 and 410 have sufficient variability to generate the desired target phase difference between iclk and qclk.

Thus, according to the present technique, a dynamic correction of clock phase offset is enabled, in which the correction of the instantaneous clock phase offset is possible. By monitoring, tracking and correcting for clock phase offset in real time, greater accuracy is possible in the provision of phase matched clock signals both at the receiver and transmitter side. Consequently, jitter tolerance on the receiver side is improved and jitter generation on the transmitter side is lessened.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:
1. A method of processing signal data, the method comprising:
   generating a first clock signal and a second clock signal, the first clock signal and the second clock signal having an initial phase offset;
   adjusting the initial phase offset of the first clock signal and the second clock signal to establish a target phase difference between the first clock signal and the second clock signal;
   processing the signal data using the first clock signal and the second clock signal after the target phase difference between the first clock signal and the second clock signal has been established;
   measuring one or more current phase differences between the first clock signal and the second clock signal during the processing of the signal data;
   generating at least one phase control signal in dependence upon the one or more current measured phase differences between the first clock signal and the second clock signal during the processing of the signal data;
   adjusting a current phase offset of at least one of the first clock signal and the second clock signal in dependence upon the at least one phase control signal, such that the target phase difference between the first clock signal and the second clock signal is maintained during the processing of the signal data; and
   wherein the signal data is received signal data and at least one of the first clock signal and the second clock signal is aligned with a recovered clock signal recovered from the received signal data.

2. The method of claim 1, wherein adjusting the initial phase offset of the first clock signal and the second clock signal to establish a target phase difference between the first clock signal and the second clock signal, further comprises:
   measuring an initial phase difference between the first clock signal and the second clock signal; and
   adjusting the initial phase offset of the first clock signal and the second clock signal by adjusting a phase of at least one of the first clock signal and the second clock signal in dependence upon the measured initial phase difference.

3. The method of claim 1, wherein adjusting a current phase offset of at least one of the first clock signal and the second clock signal is performed by at least one phase interpolator.

4. The method of claim 1, wherein adjusting a current phase offset of at least one of the first clock signal and the second clock signal is performed by at least one phase locked loop (PLL) unit.

5. The method of claim 1, wherein adjusting a current phase offset of at least one of the first clock signal and the second clock signal is performed by at least one delay unit.

6. The method of claim 1, wherein the at least one phase control signal is generated by a digital processing unit.

7. The method of claim 1, wherein the at least one phase control signal is a digital control vector.

8. The method of claim 1, wherein generating a first clock signal and a second clock signal comprises generating a single clock signal which is provided as both the first clock signal and the second clock signal.

9. The method of claim 1, wherein the target phase difference is substantially 90 degrees.

10. The method of claim 9, wherein the first clock signal is an I-clock and the second clock signal is a Q-clock.

11. The method of claim 1, wherein measuring one or more current phase differences between the first clock signal and the second clock signal during the processing of the signal data further comprises, measuring a plurality of current phase differences between the first clock signal and the second clock signal during the processing of the signal data and wherein generating at least one phase control signal in dependence upon the one or more current measured phase differences between the first clock signal and the second clock signal during the processing of the signal data further comprises, generating at least one phase control signal in dependence upon the plurality of current phase differences between the first clock signal and the second clock signal during the processing of the signal data.

12. The method of claim 1, wherein generating at least one phase control signal in dependence upon the one or more current measured phase differences between the first clock signal and the second clock signal during the processing of the signal data further comprises, generating a first phase control signal for the first clock signal and generating a second phase control signal for the second clock signal and wherein adjusting a current phase offset of at least one of the first clock signal and the second clock signal in dependence upon the at least one phase control signal further comprises, adjusting a current phase offset of the first clock signal in dependence upon the first phase control signal and adjusting a current phase offset of the second clock signal in dependence upon the second phase control signal, such that the target phase difference between the first clock signal and the second clock signal is maintained during the processing of the signal data.

13. A signal data processing apparatus comprising:
   clock generating circuitry configured to generate a first clock signal and a second clock signal, the first clock signal and the second clock signal having an initial phase offset;
   initial phase offset adjusting circuitry coupled to the first clock signal and the second clock signal, the initial phase offset adjusting circuitry to adjust the initial phase offset of the first clock signal and the second clock signal to establish a target phase difference between the first clock signal and the second clock signal;
   processing circuitry coupled to the first clock signal and the second clock signal, the processing circuitry to process the signal data after the target phase difference between the first clock signal and the second clock signal has been established;
   measuring circuitry coupled to the first clock signal and the second clock signal, the measuring circuitry to measure one or more current phase differences between the first clock signal and the second clock signal during the processing of the signal data;
   phase control signal generating circuitry coupled to the measuring circuitry, the phase control signal generating circuitry to generate at least one phase control signal in dependence upon the one or more current measured phase differences between the first clock signal and the second clock signal during the processing of the signal data;

current phase offset adjusting circuitry coupled to the phase control signal generating circuitry, the first clock signal and the second clock signal, the current phase offset adjusting circuitry to adjust a current phase offset of at least one of the first clock signal and the second clock signal in dependence upon the at least one phase control signal, such that the target phase difference between the first clock signal and the second clock signal is maintained during the processing of the signal data; and wherein the signal data is received signal data and at least one of the first clock signal and the second clock signal is aligned with a recovered clock signal recovered from the received signal data.

14. The signal data processing apparatus of claim 13, wherein the initial phase offset adjusting circuitry and the current phase offset adjusting circuitry are the same circuitry.

15. The signal data processing apparatus of claim 13, wherein the measuring circuitry measures a plurality of current phase differences between the first clock signal and the second clock signal during the processing of the signal data, and wherein the phase control signal generating circuitry generates at least one phase control signal in dependence upon the plurality of current phase differences between the first clock signal and the second clock signal during the processing of the signal data.

16. The signal data processing apparatus of claim 13, wherein the phase control generating circuitry generates a first phase control signal and a second phase control signal in dependence upon the current measured phase differences between the first clock signal and the second clock signal during the processing of the signal data, and wherein the current phase offset adjusting circuitry adjusts the first clock signal in dependence upon the first phase control signal and adjusts the second clock signal in dependence upon the second phase control signal, such that the target phase difference between the first clock signal and the second clock signal is maintained during the processing of the signal data.

17. A method of processing signal data, the method comprising:

generating a first clock signal and a second clock signal, the first clock signal and the second clock signal having an initial phase offset;

adjusting the initial phase offset of the first clock signal and the second clock signal to establish a target phase difference between the first clock signal and the second clock signal;

processing the signal data using the first clock signal and the second clock signal after the target phase difference between the first clock signal and the second clock signal has been established;

measuring a plurality of current phase differences between the first clock signal and the second clock signal during the processing of the signal data;

generating at least one phase control signal in dependence upon the plurality of current measured phase differences between the first clock signal and the second clock signal during the processing of the signal data;

adjusting a current phase offset of at least one of the first clock signal and the second clock signal in dependence upon the at least one phase control signal, such that the target phase difference between the first clock signal and the second clock signal is maintained during the processing of the signal data; and wherein the signal data is received signal data and at least one of the first clock signal and the second clock signal is aligned with a recovered clock signal recovered from the received signal data.

* * * * *